United States Patent
Kim et al.

(10) Patent No.: US 10,261,420 B2
(45) Date of Patent: Apr. 16, 2019

(54) UV MASK DEVICE AND METHOD FOR USING THE SAME

(71) Applicants: BOE TECHNOLOGY GROUP CO., LTD., Beijing (CN); BEIJING BOE DISPLAY TECHNOLOGY CO., LTD., Beijing (CN)

(72) Inventors: Jaehong Kim, Beijing (CN); Chihyeon Cho, Beijing (CN); Fuqiang Zhang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/741,751

(22) PCT Filed: Feb. 15, 2017

(86) PCT No.: PCT/CN2017/073605
§ 371 (c)(1),
(2) Date: Jan. 3, 2018

(87) PCT Pub. No.: WO2017/193661
PCT Pub. Date: Nov. 16, 2017

(65) Prior Publication Data
US 2018/0210344 A1    Jul. 26, 2018

(30) Foreign Application Priority Data

May 13, 2016  (CN) .......................... 2016 1 0325723

(51) Int. Cl.
*G03F 7/20* (2006.01)
(52) U.S. Cl.
CPC ............ *G03F 7/201* (2013.01); *G03F 7/2004* (2013.01); *G03F 7/7005* (2013.01);
(Continued)

(58) Field of Classification Search
CPC .... G03F 7/2004; G03F 7/201; G03F 7/70008; G03F 7/7005; G03F 7/70216;
(Continued)

(56) References Cited

U.S. PATENT DOCUMENTS

2002/0192569 A1* 12/2002 Ulland ................ G03F 7/70391
430/5
2008/0284999 A1* 11/2008 Thallner ............... G03F 7/7005
355/53
(Continued)

FOREIGN PATENT DOCUMENTS

| CN | 101017330 A | 8/2007 |
| CN | 101477311 A | 7/2009 |

(Continued)

OTHER PUBLICATIONS

International Search Report & Written Opinion dated Apr. 27, 2017, regarding PCT/CN2017/073605.
(Continued)

*Primary Examiner* — Steven Whitesell Gordon
(74) *Attorney, Agent, or Firm* — Westerman, Hattori, Daniels & Adrian, LLP (57) ABSTRACT

The present application discloses an ultraviolet (UV) mask device and a method for using the UV mask device. The UV mask device includes: a platform, configured for carrying a substrate thereon; a mask substrate, configured above the platform for fixing a mask corresponding to the substrate on the platform; and a light source array, configured above the mask substrate by a first distance and including a plurality of UV light-emitting diodes (UV LEDs) emitting light having a first single central wavelength.

16 Claims, 6 Drawing Sheets

(52) U.S. Cl.
CPC ........ *G03F 7/70008* (2013.01); *G03F 7/7035* (2013.01); *G03F 7/70216* (2013.01)

(58) Field of Classification Search
CPC .. G03F 7/7035; G03F 7/7045; G03F 7/70991; G03F 7/2022
See application file for complete search history.

(56) References Cited

U.S. PATENT DOCUMENTS

| | | | | |
|---|---|---|---|---|
| 2009/0002669 | A1* | 1/2009 | Liu | G03F 7/7005 355/67 |
| 2009/0168035 | A1* | 7/2009 | Kim | G03F 7/70391 355/53 |

FOREIGN PATENT DOCUMENTS

| | | |
|---|---|---|
| CN | 102289155 A | 12/2011 |
| CN | 202177766 U | 3/2012 |
| CN | 102591157 A | 7/2012 |
| CN | 202655211 U | 1/2013 |
| CN | 103000821 A | 3/2013 |
| CN | 103592821 A | 2/2014 |
| CN | 204993252 U | 1/2016 |
| CN | 105398203 A | 3/2016 |
| KR | 20120041483 A | 5/2012 |
| KR | 20130078004 A | 7/2013 |

OTHER PUBLICATIONS

First Office Action in the Chinese Patent Application No. 201610325723.8, dated May 16, 2017; English translation attached.
Second Office Action in the Chinese Patent Application No. 201610325723.8, dated Aug. 11, 2017; English translation attached.
Third Office Action in the Chinese Patent Application No. 201610325723.8, dated Sep. 30, 2017; English translation attached.
Decision of Rejection in the Chinese Patent Application No. 201610325723.8, dated Feb. 7, 2018; English translation attached.

* cited by examiner

FIG. 1

*Related Art*

UV MASK DEVICE AND METHOD FOR USING THE SAME

CROSS-REFERENCE TO RELATED APPLICATION

This application is a national stage application under 35 U.S.C. § 371 of International Application No. PCT/CN2017/073605, filed Feb. 15, 2017, which claims priority to Chinese Patent Application No. 201610325723.8, filed May 13, 2016, the contents of which are incorporated by reference in the entirety.

TECHNICAL FIELD

The present invention generally relates to display technology, more particularly, relates to an ultraviolet (UV) mask device and a method for using the UV mask device.

BACKGROUND

Currently, in the process of fabricating display panels, mercury lamps and metal halide lamps are often used as ultraviolet (UV) light sources in mask exposure machines, edge exposure machines, sealant hardeners, and lamps for hardening optical transparent resin (OCR) for making touch panels. Conventional UV light sources often have various problems and need to be improved.

SUMMARY

In one aspect, the present invention provides an ultraviolet (UV) mask device, including: a platform, configured for carrying a substrate thereon; a mask substrate, configured above the platform for fixing a mask corresponding to the substrate on the platform and a light source array, configured above the mask substrate by a first distance and including a plurality of UV light-emitting diodes (UV LEDs) emitting light with a first single central wavelength.

Optionally, a distribution density of UV LEDs increases along a direction from a central region of the light source array to an edge region of the light source array.

Optionally, a distribution density of UV LEDs at a corner region of the light source array is higher than a distribution density of UV LEDs at the edge region of the light source array.

Optionally, the light source array further includes: at least a plurality of UV LEDs emitting light with a second single central wavelength, the plurality of UV LEDs emitting light with the first single central wavelength and the plurality of UV LEDs emitting light with the second central wavelength being arranged alternately along a row direction and a column direction of the light source array.

Optionally, supplemental light is provided to light emitted at an edge of the light source array Optionally, the UV mask device further includes a chiller or a process cooling water system.

Optionally, the light source array further includes a cooling system.

Optionally, the first distance is in a range of about 50 mm to about 120 mm.

Optionally, the first distance is in a range of about 80 mm to about 100 mm.

Optionally, the first distance is about 90 nm.

Optionally, the platform and the mask substrate are configured such that the mask is fixed on a surface of the mask substrate adjacent to the platform.

Optionally, the UV mask device is one of a UV mask curing device and a UV mask exposure device.

Another aspect of the present disclosure provides a method for using an ultraviolet (UV) mask device, including: providing the UV mask device including: a platform, a mask substrate over and separated from the platform, and a light source array over the mask substrate by a first distance and including a plurality of UV light-emitting diodes (UV LEDs) emitting light with a first single central wavelength; placing a substrate, including a material to be cured, on the platform; and fixing a mask on a surface of the mask substrate adjacent to the platform; irradiating the material to be cured using the light source array through the mask, wherein the first single central wavelength corresponds to an absorption wavelength of the material to be cured.

Optionally, a distribution density of UV LEDs increases along a direction from a central region of the light source array to an edge region of the light source array.

Optionally, a distribution density of UV LEDs at a corner region of the light source array is higher than a distribution density of UV LEDs at the edge region of the light source array.

Optionally, the light source array further includes: at least a plurality of UV LEDs emitting light with a second single central wavelength, the plurality of UV LEDs emitting light with the first single central wavelength and the plurality of UV LEDs emitting light with the second single central wavelength being arranged alternately along a row direction and a column direction of the light source array.

Optionally, the method further includes providing supplemental light to light emitted at an edge of the light source array.

Optionally, the first distance is in a range of about 50 mm to about 120 mm.

Optionally, the first distance is in a range of about 80 mm to about 100 mm.

Optionally, the first distance is about 90 m.

Optionally, the platform and the mask substrate are configured such that the mask is fixed on a surface of the mask substrate adjacent to the platform.

Optionally, the UV mask device is one of a UV mask curing device and a UV mask exposure device.

In another aspect, the present invention provides a display apparatus comprising a touch control display panel described herein.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now describe more specifically with reference to the following embodiments. It is to be noted that the following descriptions of some embodiments are presented herein for purpose of illustration and description only. It is not intended to be exhaustive or to be limited to the precise form disclosed.

Conventional UV light sources, such as mercury lamps and metal halide lamps, may provide mixed wavelengths, which include those wavelengths that are useless for the desired process and may cause light loss and unstable process. In addition, conventional UV light sources contain ozone (O3) and heavy metal mercury, which can cause contamination or damages to human bodies and environment. Also, a great amount of heat may be generated during irradiation.

Figure 1:
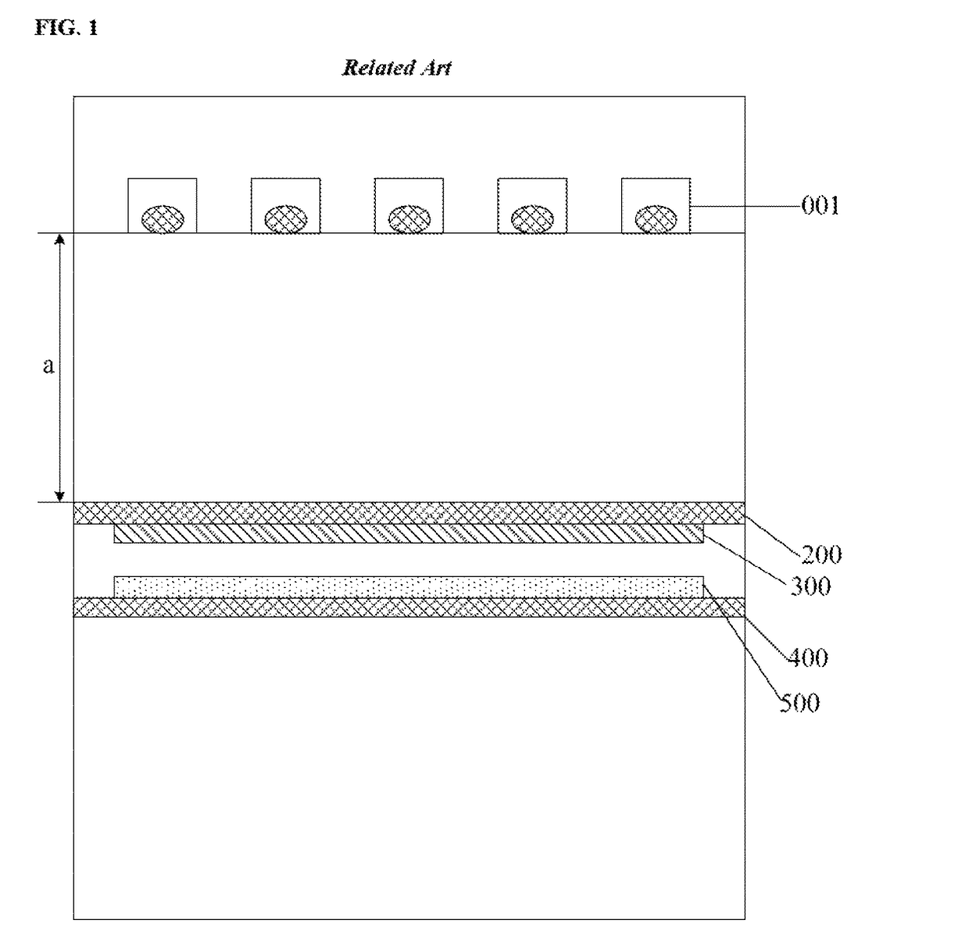
FIG. 1 illustrates a structure of a UV light mask device.

As shown in FIG. 1, a conventional UV light mask device often includes a UV lamp 001, a mask substrate 200, a mask 300, a platform 400, and a substrate 500. The UV lamp 001 and the sample being irradiated by the UV lamp 001, e.g., a mask substrate 200, need to be separated by a distance a to facilitate heat dissipation, which may decrease light utilization. Further, a conventional UV lamp is often a line light source. To ensure the light irradiated on the sample to be uniformed, the power consumption of the UV lamp needs to be increased. As a result, light loss may increase.

Embodiments of the present disclosure provide a UV light mask device.

Figure 2:
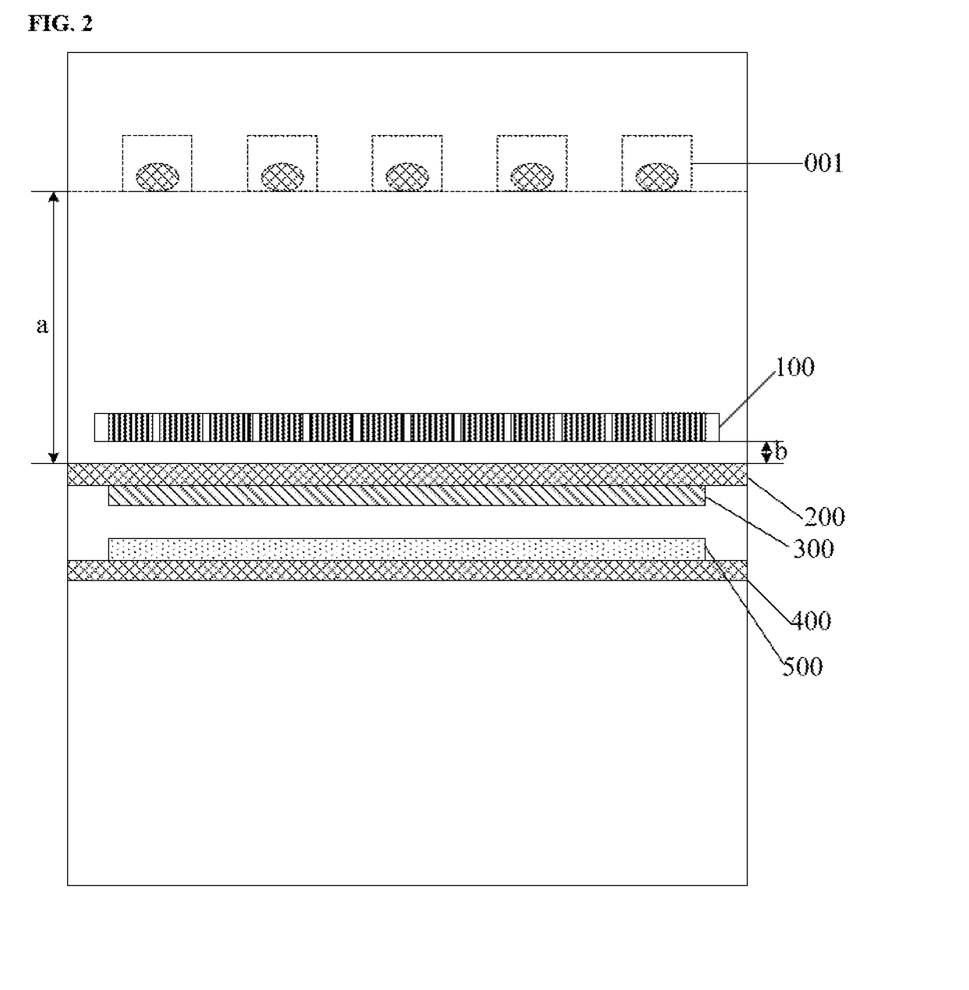
FIG. 2 illustrates an exemplary UV light mask device according to various disclosed embodiments of the present disclosure.

As shown in FIG. 2, the disclosed UV light mask device may include a light source array 100. The light source array may include a plurality of UV LEDs. The plurality of UV LEDs may include at least one type of UV LED that emits light with at least one single central wavelength. In the present disclosure, a central wavelength refers to a sufficiently narrow range of wavelengths, and the wavelengths may have a Gaussian distribution. For example, a central wavelength of 365 nm may represent a range of wavelengths having about 90% of the wavelengths between about 362 nm to about 368 nm.

The disclosed UV light mask device may also include a mask substrate 200. The mask substrate 200 may be positioned under the light source array 100 and may be separated from the light source array 100 by a certain distance or a first distance. The mask substrate 200 may be used to fix the mask 300 under the mask substrate 200.

The disclosed UV light mask device may further include a platform 400. The platform 400 may be positioned under the mask substrate 200 and may be separated from the mask substrate 200 by a certain distance or a second distance. The platform 400 may be configured to carry a substrate 500 corresponding to the mask 300 on the mask substrate 200. For example, the substrate 500 may be aligned with and/or masked by the mask 300.

In the disclosed UV light mask device, a light source array 100 containing UV LEDs that emit light at least having one single central wavelength may be used as the UV light source. The UV LEDs do not contain harmful substance such as ozone or heavy metal, e.g., mercury, and may cause little or no harm to humans or environment.

Figure 3A:
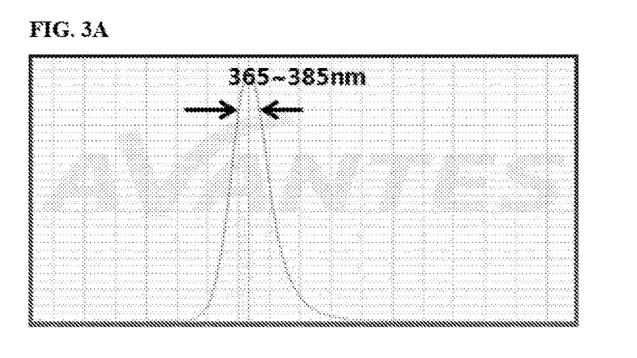
FIG. 3A illustrates a light emission spectrum by UV light-emitting diodes (LEDs) in an exemplary UV light mask device according to various disclosed embodiments of the present disclosure.
Figure 3B:
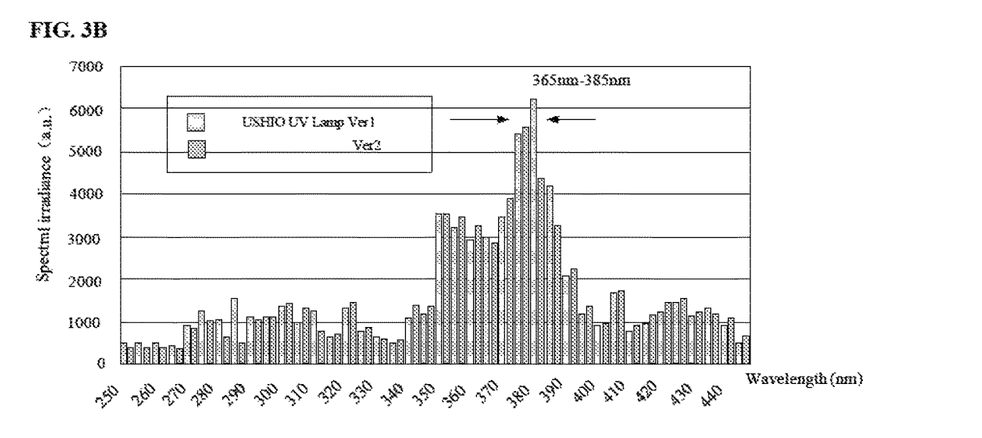
FIG. 3B illustrates a light emission spectrum by a mercury lamp and a metal halide lamp in conventional UV light mask devices.

FIGS. 3A and 3B illustrate spectral irradiance as a function of wavelength. FIG. 3A illustrates the spectral irradiance of a disclosed UV mask device, and FIG. 3B illustrates the spectral irradiance of a conventional mercury lamp and a conventional metal halide lamp. Compared to the relatively continuous wavelengths of light emitted by a conventional mercury lamp and a conventional metal halide lamp, as shown in FIG. 3B, the UV LEDs shown in FIG. 3A may emit light with a single central wavelength, for example, at about 365 n to about 385 nm. Thus, the central wavelengths emitted by the UV LEDs may be determined based on the absorption wavelengths required by materials in the substrate during a masking process. Thus, desired chemical reactions or fabrication processes may be realized, and less light may be wasted/lost. The stability of the chemical reactions and fabrication processes may be ensured.

Further, the UV LEDs form a cold light source, which generates much less heat when emitting light compared to conventional mercury lamps and conventional metal halide lamps. The distance b shown in FIG. 2 between the light source array 100, formed by the disclosed UV LEDs, and the sample that needs irradiation from the light source array 100, such as the mask substrate 200, may be reduced. Thus, light loss can be reduced and light utilization can be improved.

In some embodiments, in the disclosed UV mask device, to ensure the heat generated by the light source array 100, formed by the UV LEDs, has little or no impact on the stability of the masking process, in some embodiments, UV LEDs having a cooling system may be used. That is, the light source 100 may include a cooling system. In some embodiments, a chiller and/or a process cooling water (PCW) system may be arranged in the disclosed UV mask device.

Further, based on the improved heat-dissipating feature of the disclosed light source array 100, compared to a conventional mercury lamp and a conventional metal halide lamp, in the disclosed UV mask device, the distance between the light source array 100 and the mask substrate 200 may be significantly reduced to reduce light loss and increase light utilization. In some embodiments, in the disclosed UV mask device, the first distance between the light source array 100 and the mask substrate 200 may be in a range of about 50 mm to about 120 mm, or sometimes in a range of about 80 mm to about 100 mm. In a certain embodiment, the first distance between the light source array 100 and the mask substrate 200 may be about 90 nm.

As shown in Table 1, the light irradiation intensity and uniformity on the mask substrate 200 may be measured when the light source array 100 and the mask substrate 200 are separated from each other at different distances. The light irradiation intensity shown in Table 1 is correlated to the viewing angle and the intensity of an LED. It is shown that, a closer distance between the light source array 100 and the mask substrate 200 may correspond to a higher intensity of light irradiated on the mask substrate 200 and a lower light loss. However, as shown in Table 1, the distance between the light source array 100 and the mask substrate 200, and the light irradiation uniformity are not linearly correlated.

TABLE 1

| Distance between the light source array and the mask substrate (mm) | Light irradiation intensity (mW/cm²) | | | Light irradiation uniformity |
|---|---|---|---|---|
| | Average | Minimum | Maximum | |
| 50 | 240.3 | 224.8 | 334.4 | 77% |
| 60 | 237.5 | 225.2 | 301.7 | 84% |
| 70 | 234.7 | 224.8 | 275.3 | 89% |
| 80 | 231.9 | 223.6 | 257.7 | 93% |
| 90 | 229.1 | 216 | 243.8 | 94% |
| 100 | 226.4 | 201.3 | 235.5 | 92% |
| 110 | 223.7 | 187.1 | 233.9 | 90% |
| 120 | 221.1 | 173.3 | 233.5 | 86% |

In some embodiments, when the distance between the light source array 100 and the mask substrate 200 is in the range of about 80 mm to about 100 mm, a higher light irradiation uniformity and a lower light loss can be obtained. Further, when the distance between the light source array 100 and the mask substrate 200 is about 90 mm, the highest light irradiation uniformity may be obtained.

In some embodiments, the UV LEDs in the light source array 100 of the disclosed UV mask device may be uniformly arranged. In some other embodiments, the light emitted at the edge of the light source array 100 may not have sufficient intensity. Accordingly, supplemental light may be provided to the light emitted at the edge of the light source array 100.

Figure 4:
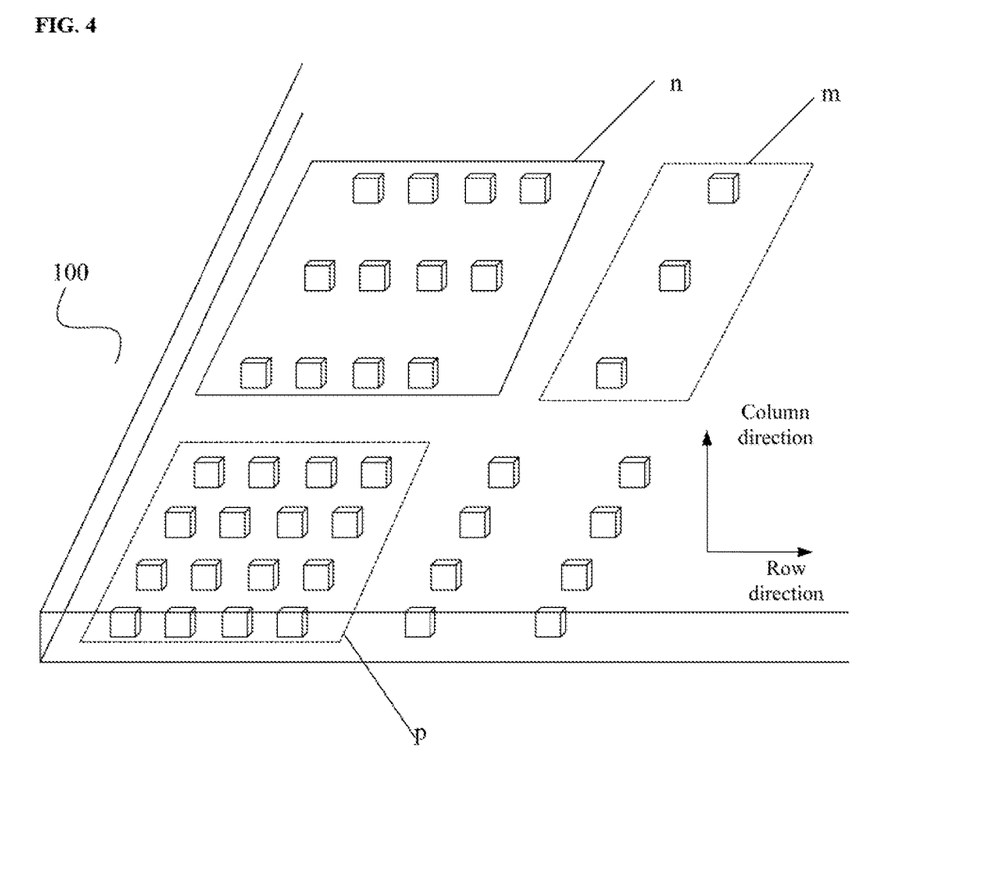
FIG. 4 illustrates a portion of a light source array in an exemplary UV light mask device according to various disclosed embodiments of the present disclosure.

For example, in some embodiments, as the light source array 100 shown in FIG. 4, the distribution density of UV LEDs may increase along a direction from the central region m to an edge region n, of the light source array 100. That is, the arrangement of UV LEDs in the edge region n of the light source array 100 may be denser, to alleviate or compensate the problem of insufficient light irradiation at the edge region n of the light source array 100. Thus, the light irradiation uniformity of the entire light source array 100 may be ensured. The central region m may be located substantially at the center of the light source array 100, and the edge region n may be located close to an edge of the light source array 100, as shown in FIG. 4.

Further, in some embodiments, as shown in FIG. 4, the distribution density of UV LEDs arranged in a corner region p may be higher than the distribution density of UV LEDs arranged in the edge region n. That is, the four corner regions p of the light source array 100 may irradiate light of a lowest intensity than an edge portion n. In some embodiments, the four corner regions p of the light source array 100 may irradiate light of the lowest intensity, compared to other regions of the light source array 100. Thus, the distribution density of UV LEDs arranged in the corner regions p may be the highest to alleviate or compensate the problem of insufficient light irradiation at the corner regions p of the light source array 100. Accordingly, the light irradiation uniformity of the entire light source array 100 may be ensured. A corner region p may be located at a corner of the light source array 100. As shown in FIG. 4, the central region may be located at or closest to the center of the array substrate 100, an edge region n may be farther away from the center of the light source array 100 than the central region m but closer to the center of the light source array 100 than a corner region p, and a corner region p may be located farthest from the center of the light source array 100.

Figure 5:
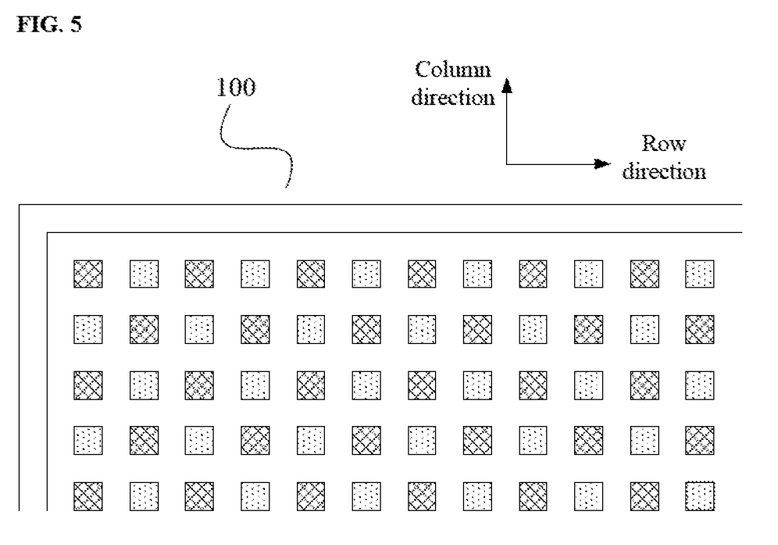
FIG. 5 illustrates another portion of a light source array in an exemplary UV light mask device according to various disclosed embodiments of the present disclosure.

Further, when using the disclosed UV mask device to perform a masking process over mixed materials having different absorption wavelengths, different types of UV LEDs may be included in the light source array 100, for example, configured for emitting light with at least two different central wavelengths. As shown in FIG. 5, the light source array 100 may include UV LEDs emitting light with single central wavelengths of about 340 nm, e.g., a first central wavelength and about 370 m, e.g., a second central wavelength. The UV LEDs emitting light with different single central wavelengths. e.g., the first central wavelength of about 340 nm and the second central wavelength of about 370 nm, may be arranged alternately along the row direction and/or along the column direction of the light source array 100. For example, a UV LED emitting light with a single central wavelength of about 340 in may be arranged between two UV LEDs each emitting light with a single central wavelength of about 370 nm, and vice versa. For illustrative purposes, in FIG. 5, only light with single central wavelengths of about 340 nm and about 370 nm are described herein as examples, although any number of different types of UV LEDs may be included in the disclosed light source array to provide any number of different single central wavelengths. In various embodiments, UV LEDs emitting light with a plurality of different single central wavelengths may be arranged according to different applications and/or designs. The specific number of central wavelengths and the arrangement of UV LEDs should not be limited by the embodiments of the present disclosure.

In various embodiments, the disclosed UV mask device may be a UV mask curing device, a UV mask exposure device, an edge exposure machine, a sealant hardener, and a lamp for hardening OCR for making touch panels, or other suitable devices. The light source array 100 may be configured to provide spectrum with desired central wavelengths, for the material to be cured, e.g., photoresist, so that the material to be cured can be treated to have desired properties.

Figure 6:
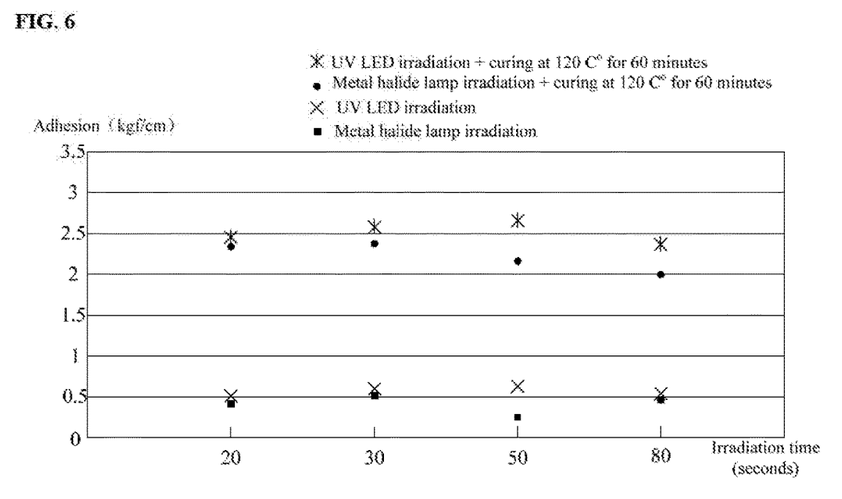
FIG. 6 illustrates an exemplary correspondence relationship between adhesion and reaction time using different fabrication processes for curing.

For example, when the disclosed UV mask device is a UV mask curing device, fabrication data of a conventional metal halide lamp may be used as a reference. Adhesion may be measured after the sample is cured by the conventional metal halide lamp for different irradiation times or reaction times. As shown in FIG. 6, when the irradiation time is about 50 seconds, the adhesion after curing by the conventional metal halide lamp may be about 0.3 kgf/cm, and the adhesion after curing by the disclosed UV LEDs may be about 0.6 kgf/cm. That is, better adhesion may be obtained using UV LEDs for curing. After being irradiated using the metal halide lamp for about 50 seconds, the sample, substrate, or the material to be cured may further be cured through heating at 120 Celsius degrees for about 60 minutes. The adhesion after cured by the metal halide lamp and heating may be about 2.2 kgf/cm. After being irradiated using the disclosed UV LEDs for about 50 seconds, the sample may further be cured through heating at 120 Celsius degrees for about 60 minutes. The adhesion after cured by the disclosed UV LEDs and heating may be about 2.4 kfg/cm. Similarly, using UV LEDs for curing may also obtain better adhesion.

Further, the measured reaction rate of curing, using a conventional metal halide lamp, may be about 80%-90%, and the measured reaction rate of curing, using the disclosed UV LEDs, may be about 94% and up. It can be shown from the comparison that, the reaction rate of curing may be significantly improved when UV LEDs are used for curing.

Figure 7:
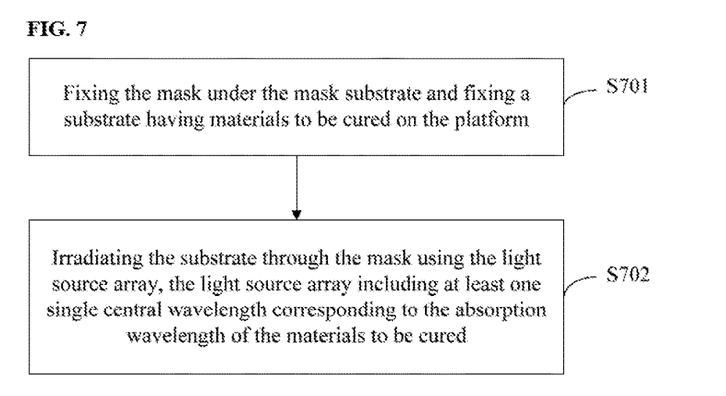
FIG. 7 illustrates a flow chart of an exemplary method for using a UV mask device according to various disclosed embodiments of the present disclosure.

The present disclosure further provides a method for using the disclosed UV mask device. The method may include steps S701-S702.

In step S701, the mask may be fixed under the mask substrate and a substrate having materials to be cured may be fixed on the platform. The materials on the substrate may be the materials, e.g., to be treated/cured using the light source array.

In step S702, the disclosed light source array may be used to irradiate the substrate through the mask. The light source array may include UV LEDs emitting light with at least one single central wavelength corresponding to the absorption wavelengths of the materials to be cured. The mask may block and transmit the irradiated UV light corresponding to the pattern of the mask.

In the UV mask device and the method for using the UV mask device disclosed by the present disclosure, a light source array, having UV LEDs emitting light with at least one single central wavelength, may be used as the UV light-emitting source. The disclosed UV LEDs have no harmful substances such as ozone or heavy metal mercury, and may not harm human bodies and environment. Further, because the UV LEDs may emit light with a single central wavelength, the specific central wavelength may be determined based on the specific absorption wavelength required by the material to be treated during the masking process, to obtain desired chemical reactions and/or fabrication processes. Thus, light loss may be decreased and the fabrication processes may be more stable. Further, the UV LEDs may be a cold light source, and may generate relatively less heat when emitting light. Compared to conventional mercury lamps and conventional metal halide lamps, the distance between the UV LEDs and the sample to be irradiated may be decreased. Thus, light loss may further be reduced to improve light utilization.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An ultraviolet (UV) mask device, comprising:
   a platform, configured for carrying a substrate thereon;
   a mask substrate, configured above the platform for fixing a mask corresponding to the substrate on the platform; and
   a light source array, configured above the mask substrate by a first distance and including a plurality of UV light-emitting diodes (UV LEDs) emitting light with a first single central wavelength,
   wherein a distribution density of UV LEDs increases along a direction from a central region of the light source array to an edge region of the light source array.

2. The UV mask device according to claim 1, wherein a distribution density of UV LEDs at a corner region of the light source array is higher than a distribution density of UV LEDs at the edge region of the light source array.

3. The UV mask device according to claim 1, wherein the light source array further includes: at least a plurality of UV LEDs emitting light with a second single central wavelength, the plurality of UV LEDs emitting light with the first single central wavelength and the plurality of UV LEDs emitting light with the second single central wavelength being arranged alternately along a row direction and a column direction of the light source array.

4. The UV mask device according to claim 1, wherein the first distance is in a range of about 50 mm to about 120 mm.

5. The UV mask device according to claim 4, wherein the first distance is in a range of about 80 mm to about 100 mm.

6. The UV mask device according to claim 5, wherein the first distance is about 90 nm.

7. The UV mask device according to claim 1, wherein the platform and the mask substrate are configured such that the mask is fixed on a surface of the mask substrate adjacent to the platform.

8. The UV mask device according to claim 1, wherein supplemental light is provided to light emitted at an edge of the light source array.

9. The UV mask device according to claim 1, wherein the UV mask device is one of a UV mask curing device and a UV mask exposure device.

10. A method for using an ultraviolet (UV) mask device, comprising:
    providing the UV mask device comprising:
       a platform,
       a mask substrate over and separated from the platform, and
       a light source array over the mask substrate by a first distance and including a plurality of UV light-emitting diodes (UV LEDs) emitting light with a first single central wavelength, wherein a distribution density of UV LEDs increases along a direction from a central region of the light source array to an edge region of the light source array;
    placing a substrate, including a material to be cured, on the platform;
    fixing a mask on a surface of the mask substrate adjacent to the platform; and
    irradiating the material to be cured using the light source array through the mask, wherein the first single central wavelength corresponds to an absorption wavelength of the material to be cured.

11. The method according to claim 10, wherein a distribution density of UV LEDs at a corner region of the light source array is higher than a distribution density of UV LEDs at the edge region of the light source array.

12. The method according to claim 10, wherein the light source array further includes: at least a plurality of UV LEDs emitting light with a second single central wavelength, the plurality of UV LEDs emitting light with the first single central wavelength and the plurality of UV LEDs emitting light with the second single central wavelength being arranged alternately along a row direction and a column direction of the light source array.

13. The method according to claim 10, further comprising providing supplemental light to light emitted at an edge of the light source array.

14. The method according to claim 10, wherein the first distance is in a range of about 50 mm to about 120 mm.

15. The method according to claim 14, wherein the first distance is in a range of about 80 mm to about 100 mm.

16. The method according to claim 15, wherein the first distance is about 90 nm.

* * * * *